United States Patent
Daval et al.

(10) Patent No.: US 9,177,961 B2
(45) Date of Patent: Nov. 3, 2015

(54) WAFER WITH INTRINSIC SEMICONDUCTOR LAYER

(75) Inventors: Nicolas Daval, Pleasantville, NY (US);
Cécile Aulnette, Guilderland, NY (US);
Bich-Yen Nguyen, Austin, TX (US)

(73) Assignee: SOITEC, Bernin (FR)

( * ) Notice: Subject to any disclaimer, the term of this patent is extended or adjusted under 35 U.S.C. 154(b) by 682 days.

(21) Appl. No.: 13/416,739

(22) Filed: Mar. 9, 2012

(65) Prior Publication Data

US 2012/0228689 A1    Sep. 13, 2012

(30) Foreign Application Priority Data

Mar. 11, 2011    (EP) .................................... 11290126

(51) Int. Cl.
| | |
|---|---|
| H01L 21/02 | (2006.01) |
| H01L 27/108 | (2006.01) |
| H01L 21/762 | (2006.01) |
| H01L 21/84 | (2006.01) |
| H01L 27/12 | (2006.01) |
| H01L 29/66 | (2006.01) |

(52) U.S. Cl.
CPC .... *H01L 27/10894* (2013.01); *H01L 21/76254* (2013.01); *H01L 21/84* (2013.01); *H01L 27/10861* (2013.01); *H01L 27/1203* (2013.01); *H01L 29/66181* (2013.01); *H01L 27/1207* (2013.01)

(58) Field of Classification Search
CPC .......... H01L 24/01; H01L 25/50; H01L 24/03
USPC .......... 438/458, 107, 118, 455; 257/E21.568, 257/E21.122
See application file for complete search history.

(56) References Cited

U.S. PATENT DOCUMENTS

| | | | |
|---|---|---|---|
| 2004/0129977 A1* | 7/2004 | Ohkubo et al. | 257/347 |
| 2006/0003555 A1 | 1/2006 | Adam et al. | |
| 2006/0202249 A1 | 9/2006 | Cheng et al. | 257/301 |
| 2009/0003105 A1 | 1/2009 | Ito et al. | 365/203 |
| 2009/0134468 A1 | 5/2009 | Tsuchiya et al. | 257/368 |
| 2009/0250738 A1 | 10/2009 | Dyer | 257/301 |
| 2010/0068886 A1 | 3/2010 | Yu et al. | |
| 2010/0176453 A1 | 7/2010 | Dennard et al. | 257/368 |

FOREIGN PATENT DOCUMENTS

| | | |
|---|---|---|
| JP | 2009-135140 A | 6/2009 |
| KR | 10-2005-0075638 A | 7/2005 |

OTHER PUBLICATIONS

European Search Report and Written Opinion, EP 11290126.9, mailed Jul. 27, 2011.

Yang, I.Y., et al., (XP-000736867) "Silicon-on-Insulator-with-Active-Substrate (SOIAS) Technology", IEEE International SOI Conference, pp. 106-107 (1996).

* cited by examiner

*Primary Examiner* — Minchul Yang
(74) *Attorney, Agent, or Firm* — TraskBritt

(57) ABSTRACT

The present disclosure relates to a method for the manufacture of a wafer by providing a doped layer on a semiconductor substrate; providing a first semiconductor layer on the doped layer; providing a buried oxide layer on the first semiconductor layer; and providing a second semiconductor layer on the buried oxide layer to form a wafer having a buried oxide layer and a doped layer beneath the buried oxide layer. The disclosure also relates to the wafer that is produced by the new method.

17 Claims, 2 Drawing Sheets

WAFER WITH INTRINSIC SEMICONDUCTOR LAYER

PRIORITY CLAIM

This application claims the benefit of the filing date of European Patent Application Serial No. 11290126.9, filed Mar. 11, 2011, for "DRAM With Trench Capacitors and Logic Back-Biased Transistors Integrated on an SOI Substrate Comprising an Intrinsic Semiconductor Layer and Manufacturing Method Thereof."

FIELD

The present disclosure relates to fully depleted CMOS devices, in particular, wafers for the manufacture of embedded DRAM devices and co-integrated on the same piece of substrate, fully depleted SOI transistors with back-biasing capability, wherein the wafers comprise intrinsic semiconductor layers.

BACKGROUND

Semiconductor-On-Insulator (SeOI) and, in particular, Silicon-On-Insulator (SOI) semiconductor devices are of increasing interest in present and future semiconductor manufacturing, for example, in the context of the Complementary Metal Oxide Semiconductor (CMOS) technology.

Embedded DRAM devices become increasingly important for high-performance CMOS electronics, since compared to conventional SRAMs, the package density can be significantly increased. Besides the high integration, lower noise and power consumption, as well as higher bandwidth, can be achieved as compared to external SRAM/DRAM architectures. In addition, planar fully depleted SOT transistors represent a cost-effective approach with respect to the scaling of transistor devices. Planar fully depleted SOI transistors advantageously allow for back-biasing in order to adjust the threshold voltage to reduce leakage power and/or boost performances. With back bias, voltage threshold can be changed dynamically. Relatively thin buried oxide (BOX) layers, for example, with a thickness in the range of 5 to 50 nm, are necessary to provide optimal back-biasing benefit.

It is known to manufacture embedded DRAMs based on wafers with a pre-doped n-layer formed in the handle substrates, directly underneath the BOX and rather thick to contain the entire DRAM capacitor trench, typically several microns. For example, a phosphorous $n^+$ layer with a concentration of $10^{19}$ cm$^{-3}$ may serve as a capacitor bottom plate. The $n^+$ layer is crucial in terms of scaling of the eDRAMs. However, there arises a problem when a logic part comprising back-biased planar fully or partially depleted SOL transistors shall be integrated together with embedded DRAMs, since the pre-doped $n^+$ layer heavily hampers the manufacture of the back-biasing features. Back-bias regions must be electrically insulated one from another in order for them to be biased at different voltages without high leakage current. To achieve that insulation, we will need reverse-biased junctions on the current path from one back-bias region to another. We will typically have N and P layers on top of the handle substrate creating the need for junctions, and then cut vertically by STI structures to insulate one region from the others.

Such multilayer structures can potentially be manufactured starting with the thick $N^+$ layer required for the eDRAM, but would require high implantation doses to be implanted through the SOI and BOX layers. This is not desirable because it might create defects and also dope the SOI layer.

In view of this, it is a problem underlying the present invention to provide a method for the integrated manufacture of both embedded DRAMS and back-biased transistors.

BRIEF SUMMARY

In order to address the above-mentioned problem, a method is provided for the manufacture of a wafer, comprising the steps of providing (e.g., by forming) a doped layer on a semiconductor substrate; providing (e.g., by forming) a first semiconductor layer on the doped layer; providing (e.g., by forming) an oxide layer on the first semiconductor layer; and providing (e.g., by forming) a second semiconductor layer on the oxide layer to form a wafer having a buried oxide layer and a doped layer beneath the buried oxide layer.

The process results in a wafer comprising a semiconductor substrate; a doped layer upon the semiconductor substrate; a first semiconductor layer upon the semiconductor substrate; an oxide layer formed upon the first semiconductor layer; and a second semiconductor layer formed upon the buried oxide layer, thus providing a wafer having a buried oxide layer and a doped layer beneath the buried oxide layer.

The thus provided wafer facilitates the manufacture of an embedded DRAM integrated together with a logic part comprising SOI transistors that are back-biased for control of the threshold voltage. Contrary to the art, there is no need for any complicated processing of a conventional wafer for preparation for the formation of back-biasing regions required by the provision of the heavily doped embedded doped layer. Rather, the provision of the first (intrinsic) semiconductor layer allows for easy conversion into n or p doped back-biasing regions for the SOI transistors of the logic part enabling a first level of Vt tuning by changing the back-bias region doping between N or P.

According to particular examples, the substrate is made of or comprises (poly- or mono) silicon. Both the first and the second semiconductor layer may comprise or consist of silicon. The buried oxide layer may comprise an $SiO_2$ compound. The doped layer may, for example, be $n^+$ doped silicon, such as silicon comprising phosphorus dopants. The concentration of such phosphorus dopants may be in the range of some $10^{18}$ to $10^{20}$ cm$^{-3}$, in particular, about $10^{19}$ cm$^{-3}$.

As far as the thicknesses of the individual layers of the provided wafer is concerned, the following suitable choices are, for example: the thickness of the first semiconductor layer may be in the range of 10 to 300 nm, in particular, 50 to 150 nm; the thickness of the second semiconductor layer may be in the range of 5 to 100 nm, in particular, 5 to 20 nm; an extra thin second semiconductor layer (5 to 15 nm) may be provided if a fully depleted SOI transistor is formed in a logic part of the wafer; a somewhat thicker second semiconductor layer (up to some 100 nm) may be provided if a partially depleted SOI transistor is formed in a logic part of the wafer; the thickness of the buried oxide layer may be in the range of 5 to 200 nm, in particular, 5 to 25 nm; and the thickness of the doped layer may be in the range of 1 to 10 μm.

According to an embodiment, the wafer may be manufactured on the basis of some wafer transfer process, for instance, a wafer transfer process comprising the SMARTCUT® process. The doped layer and the first semiconductor layer may be grown on the semiconductor substrate and the second semiconductor layer may be grown on a donor substrate and the wafer may be obtained by bonding the first and second semiconductor layers by the buried oxide layer and detaching the donor substrate.

In some detail, the manufacture of the wafer according to an example comprises the steps of growing the epitaxial doped layer on the semiconductor substrate and growing the first semiconductor epitaxial layer on the doped layer. The above-mentioned step of forming the second semiconductor layer on the buried oxide layer may comprise: growing the second semiconductor layer on a donor substrate to obtain a donor wafer; forming a first oxide layer on the second semiconductor layer grown on the donor substrate; and/or forming a second oxide layer on the epitaxial first semiconductor layer grown on the doped layer; and bonding the donor wafer to the epitaxial first semiconductor layer grown on the doped layer by the first and/or second intermediate buried layer, wherein the first and/or second oxide layer form the buried oxide layer, and removing the donor substrate. Thus, the oxide layer can be provided on either or both of the semiconductor layers to facilitate bonding of the layers together. Thereafter, a portion of the donor substrate can be removed by any one of a number of processes, including grinding, polishing, etching or detaching. Detaching may be achieved by heating the donor substrate after providing a weakened zone therein, or by the application of a mechanical force or by a laser lift-off technique. The generally known SMARTCUT® process, or a variation thereof, is the preferred way of removing the remainder of the donor substrate to transfer the second semiconductor layer and, when present, an exposed oxide layer upon it to the first semiconductor layer or, when present, the exposed oxide layer upon that layer. In such a manner, the desired wafer can be reliably formed, avoiding significant defects of the semiconductor layers.

The method for the manufacture of a wafer may further comprise doping at least a region of the first semiconductor layer by n or p dopants. For example, some predoping of the first semiconductor layer during the growth of the same on the substrate can be performed. Predoping in a concentration of about $10^{18}$ cm$^{-3}$ might be performed. Further doping might be performed in later processing steps when an embedded DRAM, together with a logic part comprising back-biased transistors, is manufactured based on the provided wafer.

The above-described examples of the inventive wafer can be used for the manufacture of a semiconductor device comprising an embedded DRAM device in a first region of the wafer and a back-biased transistor in a second region of the wafer. In particular, a method is provided for the manufacture of a semiconductor device, comprising the steps of: providing a wafer obtained by a method according to one of the herein-described examples; forming an embedded DRAM device in a first region (DRAM part) of the wafer comprising forming a capacitor trench extending from the second semiconductor layer at least partly into the doped layer; and forming a back-biased transistor in a second region (logic part) of the wafer that is separated from the first region by a shallow trench isolation and comprising forming a back-biasing region in the first semiconductor layer. The formation of the back-biasing region may particularly comprise doping of the first semiconductor layer of the wafer after it has been provided in accordance to one of the above-described examples.

By this method, an embedded DRAM device can readily be manufactured that comprises both a capacitor bottom plate for the DRAM in the form of the relatively heavily doped layer below the first (intrinsic) semiconductor layer and a back-biasing region for an SOI transistor formed in the first (intrinsic) semiconductor layer.

Furthermore, a semiconductor device is herein provided, comprising: a wafer provided in accordance with one of the herein-described examples; an embedded DRAM device integrated on that wafer comprising a capacitor trench extending from the second semiconductor layer at least partly into the doped layer and a control FET having a channel region in the second semiconductor layer; and a back-biased SOI transistor comprising a channel region in the second semiconductor layer and a doped back-biasing region in the first semiconductor layer and a contact for biasing the doped back-biasing region.

According to an example, in the provided semiconductor device, the first semiconductor layer is doped in an upper region adjacent to the buried oxide layer and undoped in a lower region adjacent to the doped layer. By doping an upper surface region of the first semiconductor layer, only a sufficiently high resistivity in the lower region between two respective contacts that may be provided for back-biasing two different transistors in the logic part of the semiconductor device is guaranteed.

The semiconductor device may comprise a number of back-biased SOI transistors separated from each other and from the embedded DRAM device by shallow trench isolations extending from the second semiconductor layer at least partly into the doped layer or into the semiconductor substrate. Both the control FET and the back-biased transistors may be provided as fully depleted or partially depleted transistor devices.

BRIEF DESCRIPTION OF THE DRAWINGS

Additional features and advantages of the present disclosure will be described with reference to the drawings. In the description, reference is made to the accompanying figures that are meant to illustrate preferred embodiments of the disclosure. It is understood that such embodiments do not represent the full scope of the disclosure.

DETAILED DESCRIPTION

Figure 1:
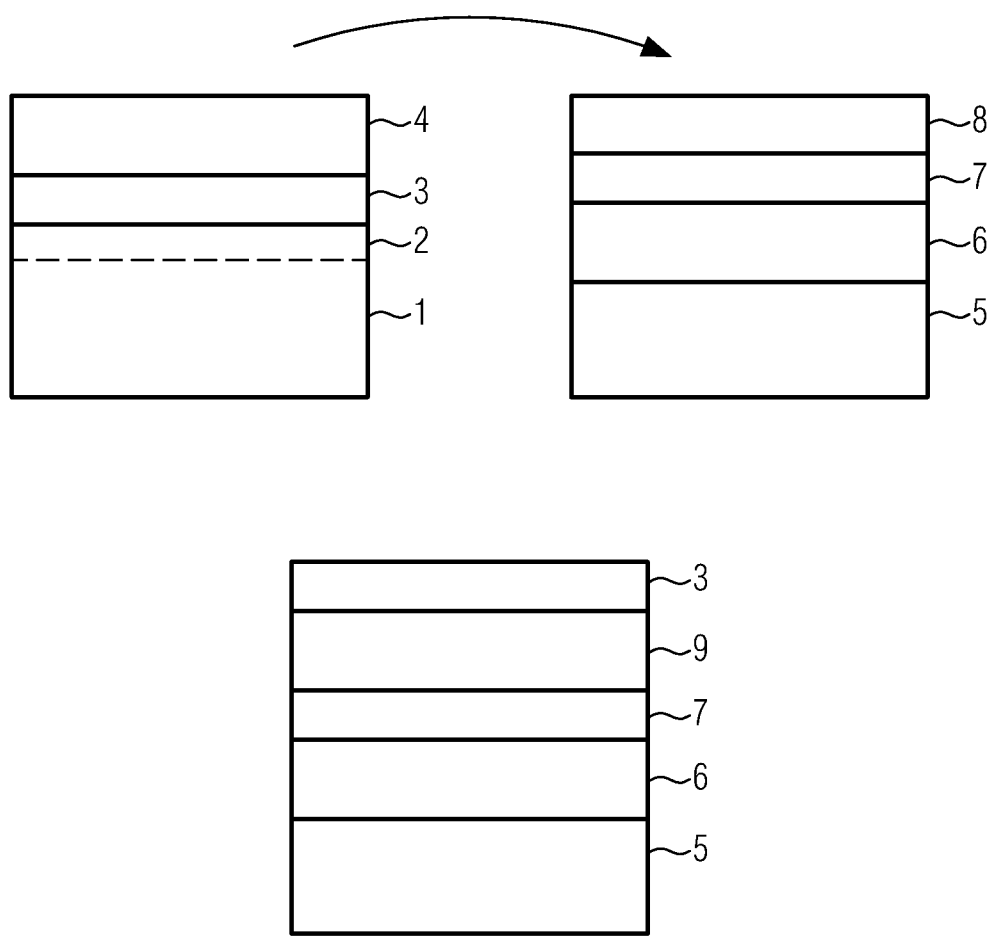
FIG. 1 illustrates an example for the method for manufacturing a wafer comprising an intrinsic semiconductor layer according to the present disclosure.

A particular example for manufacturing a wafer in accordance with the present disclosure will now be described with reference to FIG. 1. In a donor substrate 1, a nucleation layer 2 is formed by the implantation of ions. The implantation of ions results in a weakened zone at the main concentration of the implanted ions. The implantation energy may be in a range of some 5 keV to 20 keV and the implantation dose may be chosen to be in the range of $5 \times 10^{16}$ to $10^{17}$ ions/cm$^2$, for example. A silicon layer 3 is foamed on the donor substrate 1. Subsequently, an oxide layer 4 is formed atop of the silicon layer 3. Another substrate, for example, silicon substrate 5, is provided. A doped layer 6, for example, a silicon layer doped with phosphorus dopants of a concentration of $10^{19}$ cm$^{-3}$, is formed on the silicon substrate 5. A silicon layer 7 is formed on the doped layer 6. For example, silicon layer 7 can be grown by epitaxy and some dopant can be added during the epitaxial growth. Then, another oxide layer 8 is formed atop the silicon layer 7.

The structure comprising the donor substrate 1 and the silicon substrate 5 are then bonded to each other at the free surfaces of the oxide layers 4 and 8 as it is indicated by the arrow in FIG. 1. Next, stresses, for example, thermal and/or mechanical stresses, are applied to the bonded structure in order to detach the donor substrate 1 and the nucleation layer 2. For this, the SMARTCUT® process may be employed, i.e., a heat treatment is carried out at a temperature of about 500° C. to 600° C. for a time period of about 30 minutes up to about 3 hours, for example. Alternatively, a laser lift-off technique that is also known in the art may be applied in order to detach the donor substrate 1.

After detachment and a surface treatment like grinding and/or chemical-mechanical polishing, the resulting wafer is like that illustrated in the lower sketch of FIG. 1. The doped layer 6 is disposed on silicon substrate 5. The first (intrinsic) silicon layer 7 is disposed on doped layer 6. A buried oxide layer 9, resulting from the bonded oxide layers 4 and 8, is disposed on silicon layer 7. The second silicon layer 3 is disposed on buried oxide layer 9. Exemplary thicknesses of the individual layers of the wafer are as follows: the doped layer 6 may have a thickness of about, for example, 2 to 5 μm; the (intrinsic) silicon layer 7 may have a thickness of about 50 nm; the buried oxide layer 9 may have a thickness of about 5 to 25 nm; and the top silicon layer 3 may have a thickness of about 5 to 20 nm.

Figure 2:
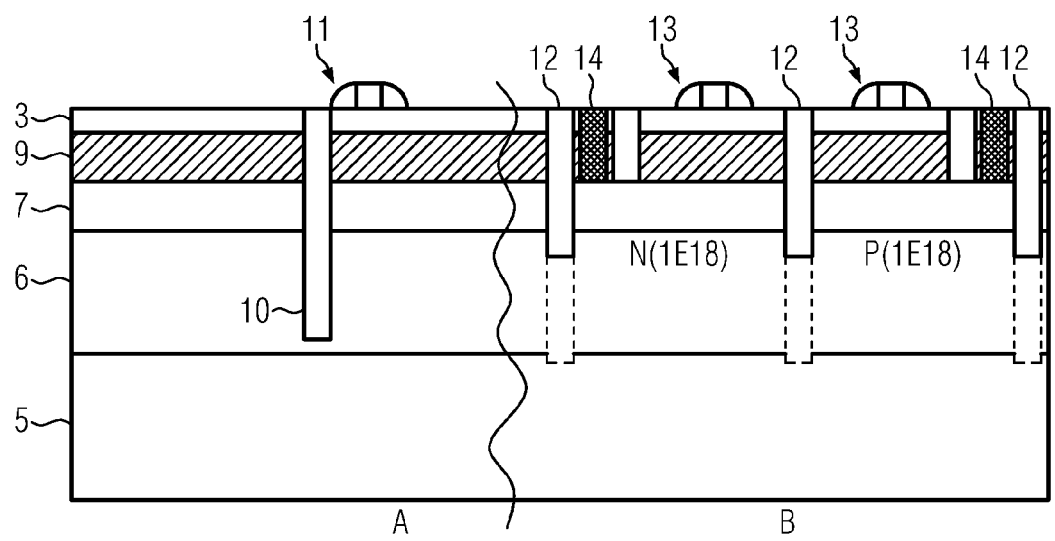
FIG. 2 illustrates an embedded DRAM device integrated with back-biased SOI transistors of a logic part manufactured on the basis on the wafer illustrated in FIG. 1.

In FIG. 2, an embedded DRAM device in a DRAM part A is illustrated, integrated with SOI transistors of a logic part B for addressing the DRAMs manufactured by means of the wafer shown in FIG. 1. On the left-hand side, the DRAM part A is illustrated and, on the right-hand side of FIG. 2, the logic part B is illustrated. In the DRAM part A, a capacitor deep trench 10 extending to the doped layer 6 that functions as a capacitor back plate is illustrated. A control FET 11 is formed in the DRAM part A with a channel region formed in the upper silicon layer 3. The control FET 11 may be realized as a fully depleted or partially depleted device. The thickness of the upper silicon layer 3 is chosen accordingly.

The DRAM part A and the logic part B are separated from each other by a shallow trench isolation 12. Transistors 13 formed in the logic part B are also separated from each other by shallow trench isolation 12. Regions of the silicon layer 7 can be easily converted into doped regions in order to form back-biasing regions for the transistors 13. For example, a region of the silicon layer 7 below the left transistor 13 in the logic part B may be n doped with a concentration of about $10^{18}$ cm$^{-3}$, whereas a region of the silicon layer 7 below the right transistor 13 in the logic part B may be p doped with a concentration of about $10^{18}$ cm$^{-3}$, depending on the Vt shift desired to induce in the transistor channels formed in the upper silicon layer 3. FIG. 2, moreover, shows contacts 14 for back-biasing. N back-biasing regions in the logic part B are connected with each other through the n$^+$ doped layer 6. In order to ensure sufficient electrical resistivity between two back-biasing contacts, it might be considered necessary to keep some part of the intrinsic silicon layer 7 undoped or p doped. Thus, the intrinsic silicon layer 7 might be provided with a thickness of about 100 to 300 nm.

It should be noted that the shallow trench isolators 12 might be provided extending partly into the doped layer 6. They might also be provided extending through the doped layer 6 and into the substrate 5, thereby cutting the n$^+$ doped layer 6. Different embedded DRAM blocks can be separated by such shallow trench isolators 12 reaching into the substrate 5.

All previously discussed embodiments are not intended as limitations but serve as examples illustrating features and advantages of the disclosure. It is to be understood that some or all of the above-described features can also be combined in different ways.

What is claimed is:

1. A method for manufacturing a semiconductor device, comprising:
   growing a doped layer on a semiconductor substrate;
   growing an intrinsic first semiconductor layer on the doped layer;
   providing an oxide layer on the intrinsic first semiconductor layer;
   providing a second semiconductor layer on the oxide layer to form a wafer having a buried oxide layer and a doped layer beneath the buried oxide layer;
   forming an embedded DRAM device in a first region of the wafer; and
   forming a back-biased transistor in a second region of the wafer different from the first region of the wafer, forming the back-biased transistor comprising forming a back-biasing region in the intrinsic first semiconductor layer by doping at least a portion of the intrinsic first semiconductor layer with n or p dopants.

2. The method according to claim 1, wherein the second semiconductor layer is provided by first being grown on a donor substrate followed by bonding of the second semiconductor layer and donor substrate to the oxide layer of the semiconductor substrate.

3. The method according to claim 2, further comprising detaching the donor substrate to transfer the second semiconductor layer to the semiconductor substrate.

4. The method according to claim 2, wherein the oxide layer is provided on at least one of the first semiconductor layer and the second semiconductor layer prior to bonding.

5. The method according to claim 1, wherein:
   growing the doped layer on the semiconductor substrate comprises epitaxial growth of the doped layer on the semiconductor substrate; and
   growing the intrinsic first semiconductor layer on the doped layer comprises epitaxial growth of the intrinsic first semiconductor layer on the doped layer.

6. The method according to claim 5, wherein providing the second semiconductor layer on the oxide layer comprises:
   growing the second semiconductor layer on a donor substrate to obtain a donor wafer;
   forming an oxide layer on at least one of the second semiconductor layer grown on the donor substrate and the intrinsic first semiconductor layer grown on the doped layer;
   bonding the donor wafer to the intrinsic first semiconductor layer using the oxide layer; and
   detaching the donor substrate to transfer the second semiconductor layer to the semiconductor substrate.

7. The method according to claim 1, wherein forming the embedded DRAM device in the first region of the wafer comprises forming a capacitor trench extending from the second semiconductor layer at least partly into the doped layer.

8. The method according to claim 1, further comprising separating the back-biased transistor in the second region of the wafer from the first region of the substrate by providing a shallow trench isolator therebetween.

9. The method according to claim 1, further comprising selecting the semiconductor substrate to comprise a silicon substrate.

10. The method according to claim 9, further comprising forming the doped layer to comprise silicon doped with phosphorous.

11. The method according to claim 10, further comprising forming the concentration of phosphorous in the silicon of the doped layer to be in the range of $10^{18}$ to $10^{20}$ cm$^{-3}$.

12. The method according to claim 1, further comprising forming the second semiconductor layer to have a layer thickness of from 5 nm to 100 nm.

13. The method according to claim 12, further comprising forming the buried oxide layer to have a layer thickness of from 5 nm to 200 nm.

14. The method according to claim 13, further comprising forming the back-biased transistor to comprise a partially depleted SOI transistor having a channel region in the second semiconductor layer.

15. The method according to claim 1, further comprising forming the second semiconductor layer to have a layer thickness of from 5 nm to 20 nm.

16. The method according to claim 15, further comprising forming the buried oxide layer to have a layer thickness of from 5 nm to 25 nm.

17. The method according to claim 16, further comprising forming the back-biased transistor to comprise a fully depleted SOI transistor having a channel region in the second semiconductor layer.

* * * * *